United States Patent
Takemura et al.

(10) Patent No.: US 10,553,742 B2
(45) Date of Patent: Feb. 4, 2020

(54) BACK-SURFACE-INCIDENT TYPE LIGHT-RECEIVING DEVICE AND OPTICAL MODULE

(71) Applicant: Mitsubishi Electric Corporation, Tokyo (JP)

(72) Inventors: Ryota Takemura, Tokyo (JP); Nobuo Ohata, Tokyo (JP); Yoshifumi Sasahata, Tokyo (JP); Kazuki Yamaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/306,788

(22) PCT Filed: Oct. 28, 2016

(86) PCT No.: PCT/JP2016/082033
§ 371 (c)(1),
(2) Date: Dec. 3, 2018

(87) PCT Pub. No.: WO2018/078788
PCT Pub. Date: May 3, 2018

(65) Prior Publication Data
US 2019/0296175 A1    Sep. 26, 2019

(51) Int. Cl.
*H01L 31/109* (2006.01)
*G01J 1/44* (2006.01)
*H01L 31/0224* (2006.01)

(52) U.S. Cl.
CPC .............. *H01L 31/109* (2013.01); *G01J 1/44* (2013.01); *H01L 31/022408* (2013.01)

(58) Field of Classification Search
CPC ..... H01L 31/10; H01L 31/107; H01L 31/109; H01L 31/022408; H01L 31/0224; G01J 1/44
(Continued)

(56) References Cited

U.S. PATENT DOCUMENTS 9,257,577 B1    2/2016  Kikuchi et al.
10,274,687 B1 *  4/2019  Shi ...................... G02B 6/4246
(Continued)

FOREIGN PATENT DOCUMENTS

JP    2011-253904 A    12/2011
JP    2014-192510 A    10/2014

OTHER PUBLICATIONS

International Search Report issued in PCT/JP2016/082033; dated Dec. 20, 2016.
(Continued)

*Primary Examiner* — Alexander O Williams
(74) *Attorney, Agent, or Firm* — Studebaker & Brackett PC

(57) ABSTRACT

A substrate has a front surface and a back surface opposite from the front surface. An n-type layer, a multiplication layer, a p-type electric field control layer, a light absorption layer, and a window layer are layered in order on the front surface. A p-type region is provided in part of the window layer. An anode electrode is provided on the p-type region and connected to the p-type region. An anode pad and a cathode pad are provided on the back surface. First and second connecting holes penetrates the substrate. A third connecting hole penetrates from the window layer to the n-type layer. The cathode pad is electrically connected to the n-type layer via the first connecting hole. The anode pad is electrically connected to the anode electrode via the second and third connecting holes. A light-receiving region is provided on the back surface.

11 Claims, 4 Drawing Sheets

(58) Field of Classification Search
USPC .......................................................... 257/184
See application file for complete search history.

(56) References Cited

U.S. PATENT DOCUMENTS

| | | | | |
|---|---|---|---|---|
| 2005/0230706 | A1* | 10/2005 | Yagyu | H01L 31/107 257/186 |
| 2006/0186501 | A1* | 8/2006 | Ishimura | H01L 31/107 257/436 |
| 2006/0202297 | A1* | 9/2006 | Ishimura | H01L 31/02161 257/436 |
| 2009/0289316 | A1* | 11/2009 | Ishimura | B82Y 20/00 257/432 |
| 2009/0294787 | A1* | 12/2009 | Nakaji | B82Y 20/00 257/98 |
| 2011/0073973 | A1* | 3/2011 | Nakaji | H01L 31/02327 257/432 |
| 2013/0193546 | A1* | 8/2013 | Webster | H01L 27/1443 257/438 |
| 2013/0200477 | A1* | 8/2013 | Sun | H01L 31/022408 257/431 |
| 2014/0167200 | A1* | 6/2014 | Sun | H01L 31/107 257/443 |
| 2015/0270814 | A1 | 9/2015 | Ban et al. | |
| 2016/0126381 | A1* | 5/2016 | Wang | H01L 31/035227 257/429 |
| 2019/0013430 | A1* | 1/2019 | Jones-Albertus | H01L 31/0687 |
| 2019/0019899 | A1* | 1/2019 | Wang | H04B 10/6971 |
| 2019/0259900 | A1* | 8/2019 | Furuyama | H01L 31/1075 |
| 2019/0288132 | A1* | 9/2019 | Wang | H01L 27/1443 |

OTHER PUBLICATIONS

Written Opinion issued in PCT/JP2016/082033; dated Dec. 20, 2016.

Notification of Transmittal of the International Search Report and the Written Opinion of the International Searching Authority, or the Declaration issued in PCT/JP2016/082033; dated Dec. 20, 2016.

* cited by examiner

BACK-SURFACE-INCIDENT TYPE LIGHT-RECEIVING DEVICE AND OPTICAL MODULE

FIELD

The present invention relates to a back-surface-incident type light-receiving device and an optical module used for optical fiber communications and the like.

BACKGROUND

The structures of semiconductor light-receiving devices are roughly classified into: a front-surface-incident type that receives light incident from a front surface of an epitaxial growth layer on a semiconductor substrate; an end-face-incident type that receives light incident from a side face of the epitaxial growth layer; and a back-surface-incident type that receives light incident from a back surface of a semiconductor substrate.

Generally, a semiconductor light-receiving device can sense light only in a p-n junction region. A larger p-n junction region can more easily adjust the optical axis and provides good mountability. On the other hand, the device capacitance increases with the size of the p-n junction region, which is not advantageous in respect of high-speed response because of increased time constant.

Since back-surface-incident type light-receiving devices can readily be designed with low parasitic capacitance, the p-n joint region can be made accordingly larger, which makes it feasible to achieve both of easy mountability and high-speed operation enabled by reduction of device capacitance. The back-surface-incident type is therefore a commonly used structure for high-speed communications, in particular with a rate of 10 Gbps or more. Moreover, a high quantum efficiency is easier to achieve with a back-surface-incident type light-receiving device because light incident from the backside of the substrate is reflected by electrode metal mirrors back to an absorption layer to be absorbed again. Optical modules using such back-surface-incident type light-receiving devices have been disclosed (see, for example, PTL 1 and PTL 2).

CITATION LIST

Patent Literature

[PTL 1] Japanese Patent Application Laid-open No. 2014-192510
[PTL 2] Japanese Patent Application Laid-open No. 2011-253904

SUMMARY

Technical Problem

Since anodes and cathodes of back-surface-incident type light-receiving devices are formed on the front surface of the substrate, the anodes and cathodes are die-bonded to metal patterns formed on a submount using solder, Au bumps or the like, with wires provided to respective metal patterns. One problem here was that the necessity to form the patterns for the wires on the submount increased the size of the submount.

Another problem was that Au wires connecting other circuit components such as TIAs and capacitors with the back-surface-incident type light-receiving device extend over wiring patterns on the submount that has a different dielectric constant, because of which high-frequency reflection points were increased, causing resonance and lowering reception sensitivity.

The present invention was made to solve the problems described above and it is an object of the invention to provide a back-surface-incident type light-receiving device and an optical module that enable size reduction to improve reception sensitivity.

Solution to Problem

A back-surface-incident type light-receiving device according to the present invention includes: a substrate having a front surface and a back surface opposite from the front surface; an n-type layer, a multiplication layer, a p-type electric field control layer, a light absorption layer, and a window layer which are layered in order on the front surface; a p-type region provided in part of the window layer; an anode electrode provided on the p-type region and connected to the p-type region; and an anode pad and a cathode pad which are provided on the back surface, wherein first and second connecting holes penetrate the substrate, a third connecting hole penetrates from the window layer to the n-type layer, the cathode pad is electrically connected to the n-type layer via the first connecting hole, the anode pad is electrically connected to the anode electrode via the second and third connecting holes, and a light-receiving region is provided on the back surface.

Advantageous Effects of Invention

The present invention has the anode pad and cathode pad on the back surface of the substrate, so that the wires for connecting them to other circuit components can be directly formed on the back surface of the substrate of the back-surface-incident type light-receiving device. Patterns on the submount are therefore not necessary, so that the submount can be made smaller. Since there are no high frequency reflection points, resonance hardly occurs, and accordingly the reception sensitivity can be improved.

DESCRIPTION OF EMBODIMENTS

A back-surface-incident type light-receiving device and an optical module according to the embodiments of the present invention will be described with reference to the drawings. The same components will be denoted by the same symbols, and the repeated description thereof may be omitted.

Embodiment 1

Figure 1:
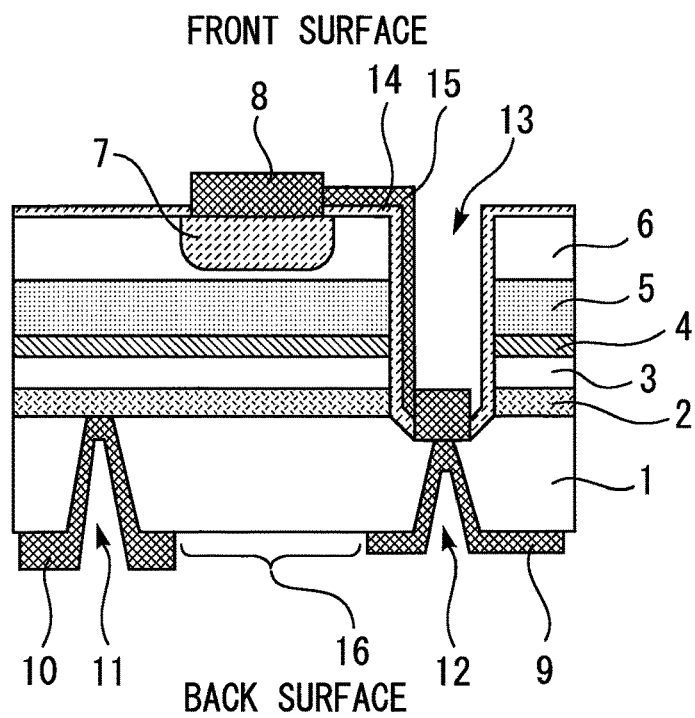
FIG. 1 is a cross-sectional view illustrating a back-surface-incident type light-receiving device according to Embodiment 1 of the present invention.

FIG. 1 is a cross-sectional view illustrating a back-surface-incident type light-receiving device according to Embodiment 1 of the present invention. The substrate 1 is a semi-insulating InP substrate having a front surface and a back surface opposite from the front surface. An n-type layer 2, an AlInAs multiplication layer 3, an InP p-type electric field control layer 4, an InGaAs light absorption layer 5, and an InP window layer 6 are layered in order on the front surface of the substrate 1. A p-type region 7 is formed in part of the window layer 6. An anode electrode 8 is formed on the p-type region 7 and connected to the p-type region 7.

An anode pad 9 and a cathode pad 10 are formed on the back surface of the substrate 1. First and second connecting holes 11 and 12 penetrating the substrate 1 are formed by etching. A third connecting hole 13 penetrating from the window layer 6 to the n-type layer 2 is formed by etching such as to be connected at least partly to the second connecting hole 12. An upper surface of the InP window layer 6 and inner side faces of the third connecting hole 13 are covered by a passivation film 14 of SiN or the like.

The cathode pad 10 is electrically connected to the n-type layer 2 via the first connecting hole 11. The anode pad 9 is electrically connected to the anode electrode 8 via anode wiring 15 inside the second connecting hole 12 and the third connecting hole 13. The substrate 1 has a light-receiving region 16 on the back surface in the area other than the anode pad 9 and the cathode pad 10.

Figure 2:
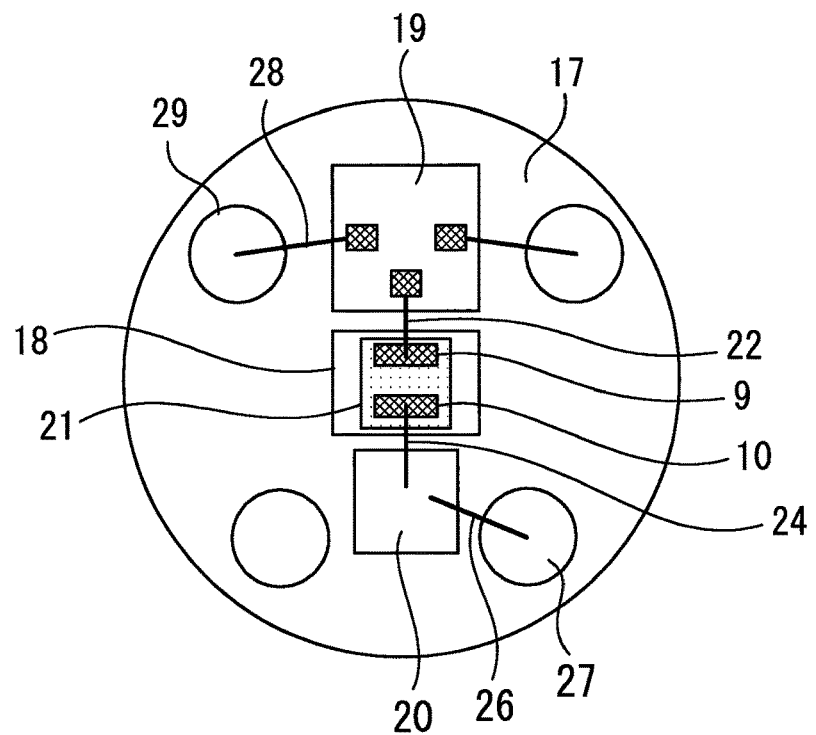
FIG. 2 is a plan view illustrating an optical module according to Embodiment 1 of the present invention.
Figure 3:
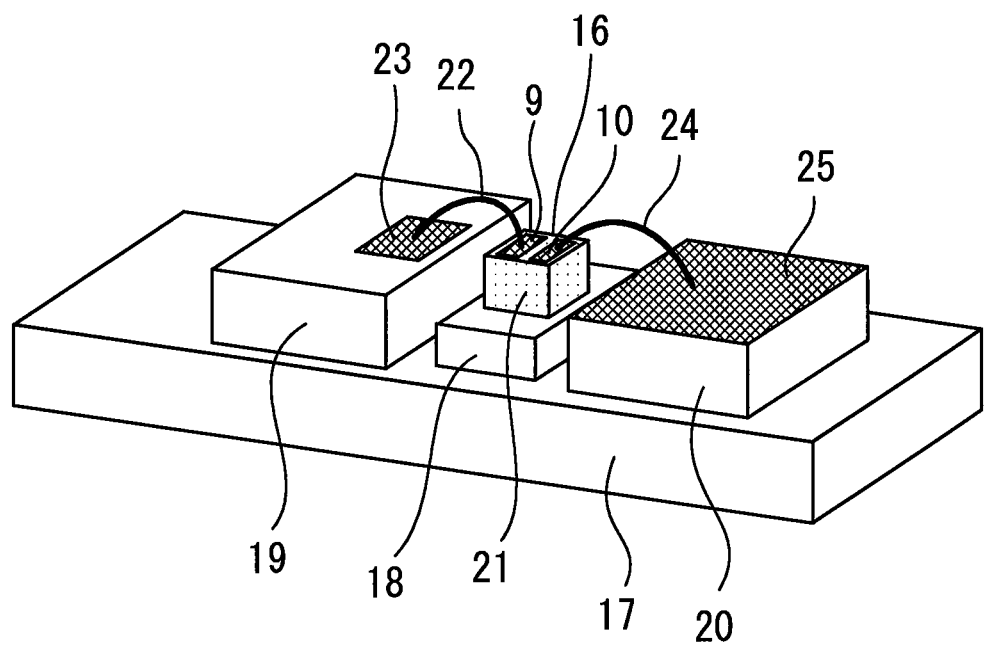
FIG. 3 is a perspective view illustrating major parts of the optical module according to Embodiment 1 of the present invention.

FIG. 2 is a plan view illustrating an optical module according to Embodiment 1 of the present invention. FIG. 3 is a perspective view illustrating major parts of the optical module according to Embodiment 1 of the present invention. A submount 18, TIA (transimpedance amplifier) 19, and a capacitor 20 are fixed with solder on a can package carrier 17. The back-surface-incident type light-receiving device 21 is fixed on the submount 18 with its light-receiving region 16 facing upward. The anode pad 9 is connected to a bonding pad 23 of the TIA 19 via an Au wire 22. The cathode pad 10 is connected to a bonding pad 25 of the capacitor 20 via an Au wire 24. The capacitor 20 is connected to a lead terminal 27 via an Au wire 26. The TIA 19 is connected to a lead terminal 29 via an Au wire 28. The design is not limited to this and the cathode pad 10 and anode pad 9 of the back-surface-incident type light-receiving device 21 may be connected to other circuit components such as resistors or lead terminals.

Figure 4:
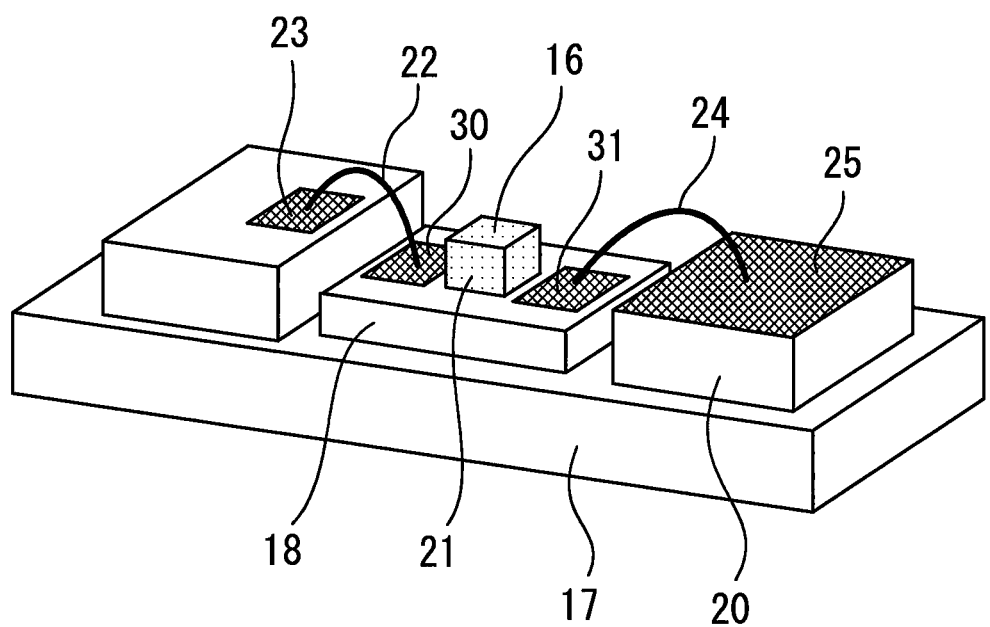
FIG. 4 is a perspective view illustrating an optical module that uses a back-surface-incident type light-receiving device of a comparative example.

Next, the effects of this embodiment will be explained in comparison to a comparative example. FIG. 4 is a perspective view illustrating an optical module that uses a back-surface-incident type light-receiving device of a comparative example. The anode and cathode of the back-surface-incident type light-receiving device 21 according to the comparative example are formed on the front surface of the substrate. Therefore, metal patterns 30 and 31 need to be formed on the submount 18 to provide wires extending from the anode and cathode, so that the submount 18 has to have a larger size. High frequency reflection points are accordingly increased, which cause resonance and lower the reception sensitivity.

On the other hand, the back-surface-incident type light-receiving device 21 according to this embodiment has the anode pad 9 and cathode pad 10 on the back surface of the substrate, so that the wires for connecting them to other circuit components can be directly formed on the back surface of the substrate of the back-surface-incident type light-receiving device 21. Patterns on the submount 18 are therefore not necessary, so that the submount 18 can be made smaller. Since there are no high frequency reflection points, resonance hardly occurs, and accordingly the reception sensitivity can be improved.

The p-type electric field control layer 4 may be made of AlInAs. The light absorption layer 5 may be made of InGaAsP or the like instead of InGaAs, as long as the material has a small band gap relative to the incident light. The window layer 6 may be made of AlInAs, AlGaInAs, InGaAsP and the like, as long as the material has a large band gap relative to the incident light. A layer of AlGaInAs, InGaAsP, InGaAs or the like may be provided between the p-type region 7 and the anode electrode 8 in order to reduce contact resistance. The light-receiving region 16 may partly be provided with an anti-reflection (AR) coating which is an insulating film or the like. Any materials may be used for each of the layers for achieving characteristics necessary for the operation. The materials mentioned above shall not limit the scope of the present invention. The p-type region 7 may be formed by thermal diffusion, ion injection and the like, but the forming method is not limited particularly.

Embodiment 2

Figure 5:
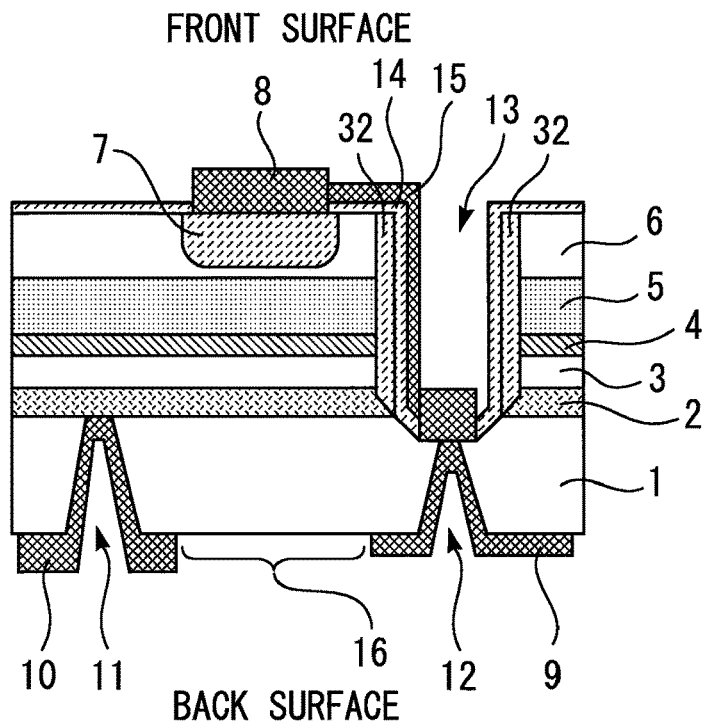
FIG. 5 is a cross-sectional view illustrating a back-surface-incident type light-receiving device according to Embodiment 2 of the present invention.

FIG. 5 is a cross-sectional view illustrating a back-surface-incident type light-receiving device according to Embodiment 2 of the present invention. The etched hole penetrates from the light absorption layer to the n-type layer and is embedded with a semi-insulating layer 32 containing Fe—InP or Ru—InP. The third connecting hole 13 is formed in the semi-insulating layer 32. This makes the distance between the anode wiring 15 and the semiconductor layer wider, so that reliability is improved. Other configurations and effects are similar to those of Embodiment 1.

Embodiment 3

Figure 6:
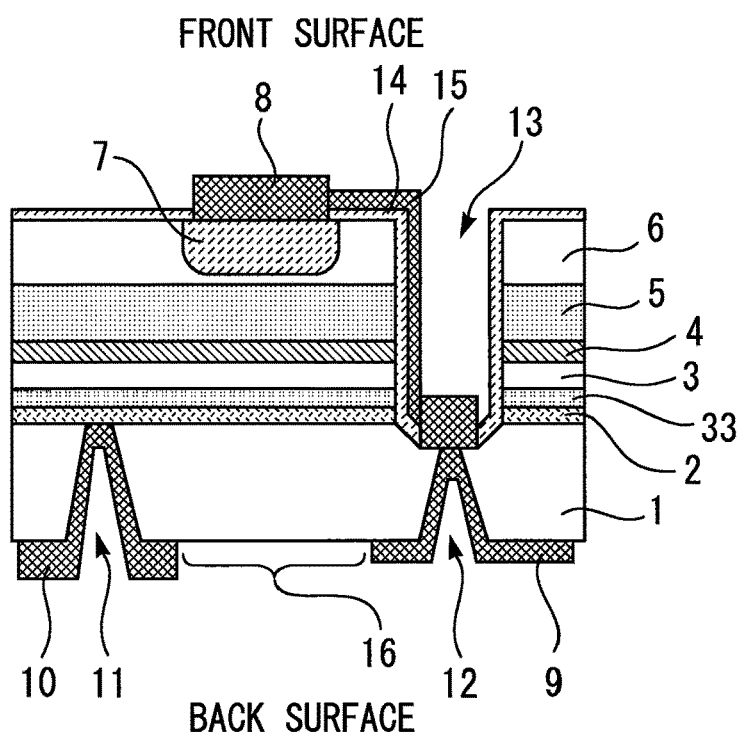
FIG. 6 is a cross-sectional view illustrating a back-surface-incident type light-receiving device according to Embodiment 3 of the present invention.

FIG. 6 is a cross-sectional view illustrating a back-surface-incident type light-receiving device according to Embodiment 3 of the present invention. An etch stop layer 33 that is not InP is inserted between the n-type layer 2 and the multiplication layer 3. This allows for selective etching when forming the second connecting hole 12 by etching from the substrate side, and when forming the third connecting hole 13 by etching from the epitaxial surface side. Thus the second and third connecting holes 12 and 13 can be readily formed. Other configurations and effects are similar to those of Embodiment 1.

Embodiment 4

Figure 7:
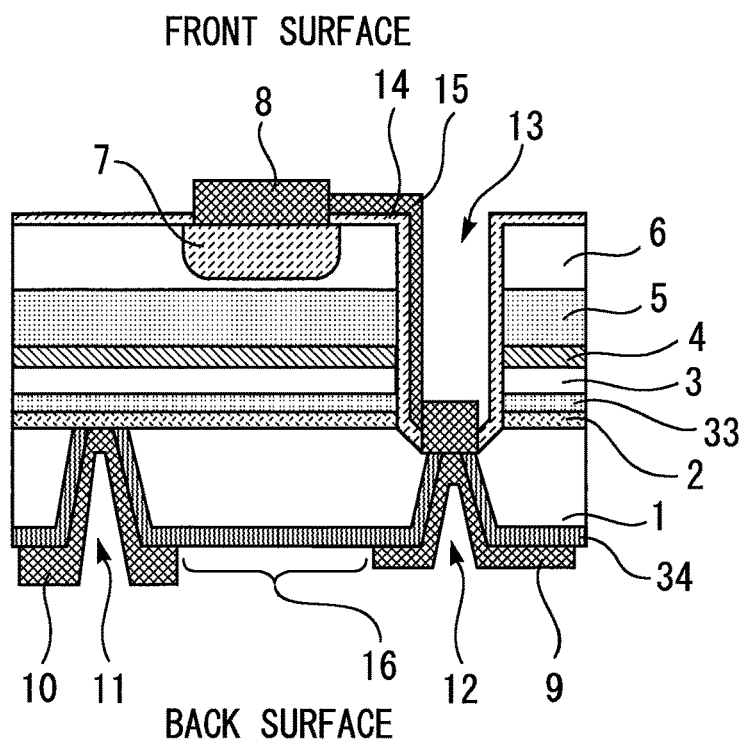
FIG. 7 is a cross-sectional view illustrating a back-surface-incident type light-receiving device according to Embodiment 4 of the present invention.

FIG. 7 is a cross-sectional view illustrating a back-surface-incident type light-receiving device according to Embodiment 4 of the present invention. An insulating film 34 is formed between the substrate 1 and the anode and cathode pads 9 and 10. This allows the substrate 1 to have any polarities, so that a conductive substrate can be used.

Also, the anode pad 9 and cathode pad 10 can be formed without being affected by the polarity of the substrate, which makes the fabrication easy. Other configurations and effects are similar to those of Embodiment 3.

Embodiment 5

Figure 8:
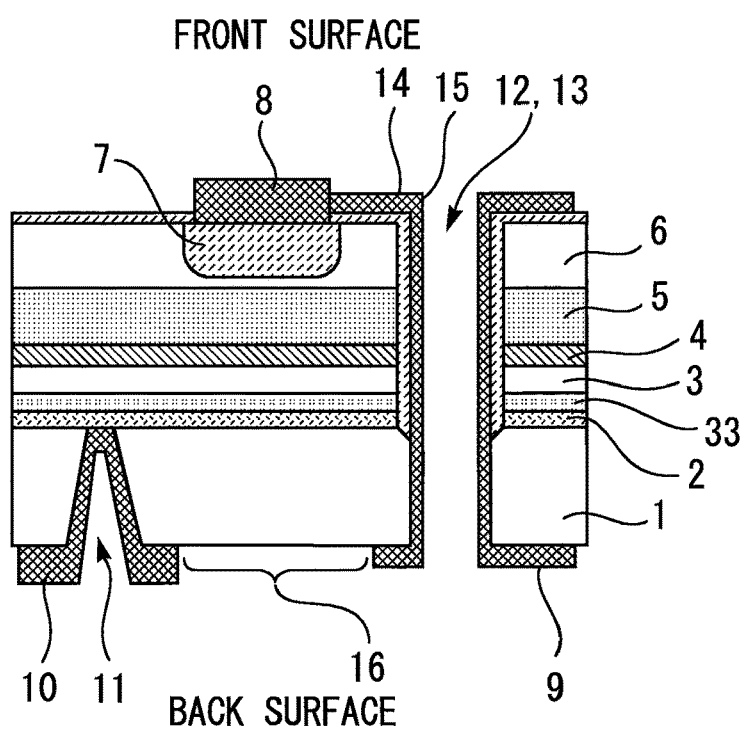
FIG. 8 is a cross-sectional view illustrating a back-surface-incident type light-receiving device according to Embodiment 5 of the present invention.

FIG. 8 is a cross-sectional view illustrating a back-surface-incident type light-receiving device according to Embodiment 5 of the present invention. The second and third connecting holes 12 and 13 continuously penetrate from the substrate 1 to the window layer 6. This eliminates the need to etch both sides of the substrate, which makes the fabrication easy. Other configurations and effects are similar to those of Embodiment 1.

REFERENCE SIGNS LIST

1 substrate; 2 n-type layer; 3 multiplication layer; 4 p-type electric field control layer; 5 light absorption layer; 6 window layer; 7 p-type region; 8 anode electrode; 9 anode pad; 10 cathode pad; 11 first connecting hole; 12 second connecting hole; 13 third connecting hole; 16 light-receiving region; 18 submount; 19 TIA (second circuit component); 20 capacitor (first circuit component); 21 back-surface-incident type light-receiving device; 22 Au wire (second wire); 24 Au wire (first wire); 32 semi-insulating layer; 33 etch stop layer; 34 insulating film

The invention claimed is:

1. A back-surface-incident type light-receiving device comprising:
   a substrate having a front surface and a back surface opposite from the front surface;
   an n-type layer, a multiplication layer, a p-type electric field control layer, a light absorption layer, and a window layer which are layered in order on the front surface;
   a p-type region provided in part of the window layer;
   an anode electrode provided on the p-type region and connected to the p-type region; and
   an anode pad and a cathode pad which are provided on the back surface,
   wherein first and second connecting holes penetrate the substrate,
   a third connecting hole penetrates from the window layer to the n-type layer,
   the cathode pad is electrically connected to the n-type layer via the first connecting hole,
   the anode pad is electrically connected to the anode electrode via the second and third connecting holes, and
   a light-receiving region is provided on the back surface.

2. The back-surface-incident type light-receiving device according to claim 1, wherein an etched hole penetrates from the window layer to the n-type layer and is embedded with a semi-insulating layer, and
   the third connecting hole is provided in the semi-insulating layer.

3. The back-surface-incident type light-receiving device according to claim 1, further comprising an etch stop layer inserted between the n-type layer and the multiplication layer.

4. The back-surface-incident type light-receiving device according to claim 1, wherein the second and third connecting holes continuously penetrate from the substrate to the window layer.

5. The back-surface-incident type light-receiving device according to claim 1, further comprising an insulating film provided between the substrate and the anode and cathode pads,
   wherein the substrate is a conductive substrate.

6. An optical module comprising:
   a submount;
   the back-surface-incident type light-receiving device according to claim 1 fixed on the submount with the light-receiving region facing upward;
   first and second circuit components;
   a first wire connecting the cathode pad to the first circuit component; and
   a second wire connecting the anode pad to the second circuit component.

7. The back-surface-incident type light-receiving device according to claim 2, further comprising an etch stop layer inserted between the n-type layer and the multiplication layer.

8. The back-surface-incident type light-receiving device according to claim 2, further comprising an insulating film provided between the substrate and the anode and cathode pads,
   wherein the substrate is a conductive substrate.

9. The back-surface-incident type light-receiving device according to claim 3, further comprising an insulating film provided between the substrate and the anode and cathode pads,
   wherein the substrate is a conductive substrate.

10. The back-surface-incident type light-receiving device according to claim 7, further comprising an insulating film provided between the substrate and the anode and cathode pads,
    wherein the substrate is a conductive substrate.

11. The back-surface-incident type light-receiving device according to claim 4, further comprising an insulating film provided between the substrate and the anode and cathode pads,
    wherein the substrate is a conductive substrate.

* * * * *